(12) United States Patent
Tien et al.

(10) Patent No.: US 11,906,898 B2
(45) Date of Patent: Feb. 20, 2024

(54) METHOD OF MANUFACTURING PHASE SHIFT PHOTO MASKS

(71) Applicant: TAIWAN SEMICONDUCTOR MANUFACTURING CO., LTD., Hsinchu (TW)

(72) Inventors: Chun-Chieh Tien, Kaohsiung (TW); Cheng-Hsuen Chiang, Miaoli (TW); Chih-Ming Chen, Dasi Township (TW); Cheng-Ming Lin, Siluo Township (TW); Yen-Wei Huang, Tainan (TW); Hao-Ming Chang, Pingtung (TW); Kuo-Chin Lin, Tainan (TW); Kuan-Shien Lee, Taichung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 566 days.

(21) Appl. No.: 16/989,744

(22) Filed: Aug. 10, 2020

(65) Prior Publication Data
US 2020/0371425 A1    Nov. 26, 2020

Related U.S. Application Data

(63) Continuation of application No. 15/905,543, filed on Feb. 26, 2018, now Pat. No. 10,739,671.

(Continued)

(51) Int. Cl.
*G03F 1/32* (2012.01)
*G03F 1/38* (2012.01)
(Continued)

(52) U.S. Cl.
CPC .................. *G03F 1/32* (2013.01); *G03F 1/38* (2013.01); *G03F 1/80* (2013.01); *H01L 21/3083* (2013.01)

(58) Field of Classification Search
None
See application file for complete search history.

(56) References Cited

U.S. PATENT DOCUMENTS

| 5,437,757 A | 8/1995 | Rice et al. |
| 5,641,592 A | 6/1997 | Kim |

(Continued)

FOREIGN PATENT DOCUMENTS

| CN | 202600360 U | 12/2012 |
| JP | H04-094125 A | 3/1992 |

(Continued)

OTHER PUBLICATIONS

Non-Final Office Action issued in U.S. Appl. No. 15/905,543, dated Sep. 26, 2019.

(Continued)

*Primary Examiner* — Sylvia Macarthur
(74) *Attorney, Agent, or Firm* — Studebaker & Brackett PC

(57) ABSTRACT

In a method of manufacturing a photo mask, a resist layer is formed over a mask blank, which includes a mask substrate, a phase shift layer disposed on the mask substrate and a light blocking layer disposed on the phase shift layer. A resist pattern is formed by using a lithographic operation. The light blocking layer is patterned by using the resist pattern as an etching mask. The phase shift layer is patterned by using the patterned light blocking layer as an etching mask. A border region of the mask substrate is covered with an etching hard cover, while a pattern region of the mask substrate is opened. The patterned light blocking layer in the pattern region is patterned through the opening of the etching hard cover. A photo-etching operation is performed on the pattern region to remove residues of the light blocking layer.

20 Claims, 15 Drawing Sheets

Related U.S. Application Data

(60) Provisional application No. 62/584,556, filed on Nov. 10, 2017.

(51) Int. Cl.
   *H01L 21/308*   (2006.01)
   *G03F 1/80*   (2012.01)

(56) References Cited

U.S. PATENT DOCUMENTS

| | | |
|---|---|---|
| 5,789,117 A | 8/1998 | Chen |
| 6,123,864 A | 9/2000 | Tam et al. |
| 6,607,634 B2 | 8/2003 | Ye et al. |
| 6,803,158 B1 | 10/2004 | Gordon et al. |
| 7,655,364 B2 | 2/2010 | Kominato et al. |
| 10,276,426 B2 | 4/2019 | Tu et al. |
| 2002/0039689 A1 | 4/2002 | Yusa et al. |
| 2002/0127821 A1 | 9/2002 | Ohya et al. |
| 2005/0150860 A1 | 7/2005 | Fujisawa |
| 2007/0012336 A1 | 1/2007 | Su et al. |
| 2007/0190459 A1 | 8/2007 | Hashimoto et al. |
| 2008/0199783 A1 | 8/2008 | Chang et al. |
| 2009/0075181 A1 | 3/2009 | Ha |
| 2009/0253054 A1 | 10/2009 | Kominato et al. |
| 2011/0159411 A1 | 6/2011 | Olson et al. |
| 2014/0329171 A1 | 11/2014 | Imaizumi et al. |
| 2016/0167167 A1* | 6/2016 | McCallum ........... B23K 26/361 219/121.68 |
| 2017/0275759 A1* | 9/2017 | Kurita ............... C23C 16/45591 |
| 2018/0259843 A1 | 9/2018 | Fukaya et al. |
| 2018/0284603 A1* | 10/2018 | Iino .................... H01J 37/32743 |
| 2019/0252237 A1 | 8/2019 | Tu et al. |
| 2020/0371425 A1* | 11/2020 | Tien .................... H01L 21/3083 |

FOREIGN PATENT DOCUMENTS

| | | |
|---|---|---|
| JP | H04-303928 A | 10/1992 |
| JP | 2012-074533 A | 4/2012 |
| JP | 2014-154866 A | 8/2014 |
| JP | 2014-204062 A | 10/2014 |

OTHER PUBLICATIONS

Final Office Action issued in U.S. Appl. No. 15/905,543, dated Jan. 16, 2020.

Notice of Allowance issued in U.S. Appl. No. 15/905,543, dated Apr. 2, 2020.

* cited by examiner

METHOD OF MANUFACTURING PHASE SHIFT PHOTO MASKS

CROSS-REFERENCE TO RELATED APPLICATIONS

This application is a continuation application of U.S. non-provisional application Ser. No. 15/905,543 (now U.S. Pat. No. 10,739,671) filed Feb. 26, 2018, which claims priority to U.S. Provisional Patent Application 62/584,556, filed Nov. 10, 2017, the entire disclosure of which is incorporated herein by reference.

TECHNICAL FIELD

The disclosure relates to methods of manufacturing phase shift photo masks.

BACKGROUND

As semiconductor device feature sizes have decreased to sizes smaller than the wavelength of light used in photolithographic processes, the diffraction of light at feature pattern edges formed on the reticle causes a loss of resolution in transferring the reticle pattern to the wafer photoresist. To increase the resolution of photolithographic pattern transfer, phase shift masks have been developed where the phase of the wavefronts of light passing through alternating portions of the reticle pattern are shifted out of phase with respect to light passing through adjacent portions to produce destructively interfering wavefronts to reduce undesired exposure of the wafer photoresist due to diffraction of light at feature edges of the reticle pattern. As a result, the contrast, and therefore transferable resolution of the reticle pattern is improved.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

Embodiments of the present disclosure provide a method of manufacturing a phase shift photo mask with lower chromium (Cr) defect density.

While there exists within the art of microelectronic fabrication various types of phase shift photo masks which effectively provide for enhanced intensity resolution of a photo exposure radiation beam passed through a phase shift photo mask for use, when forming a patterned photoresist layer from a blanket photoresist layer, from a practical perspective of ease of fabrication, a particularly desirable phase shift photo mask is an attenuated phase shift photo mask.

Figure 1:
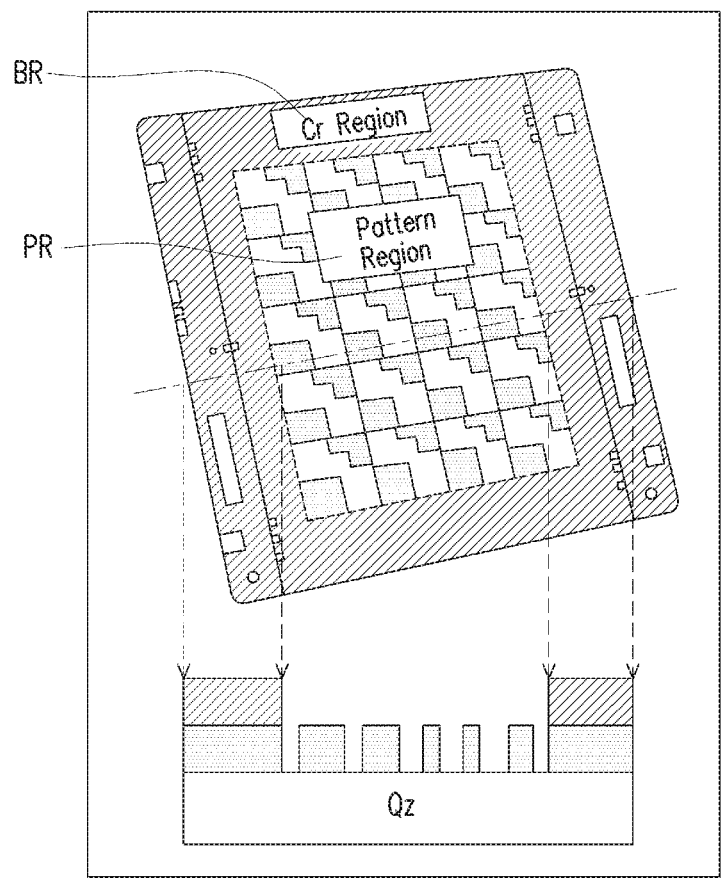
FIG. 1 shows a view of a phase shift photo mask.
Figure 11:
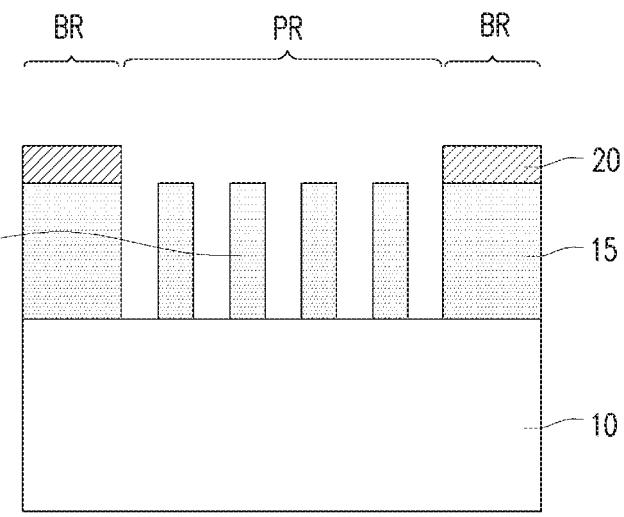
FIG. 11 shows one of various stages of a sequential manufacturing process of a phase shift photo mask according to one embodiment of the present disclosure.
Figure 24:
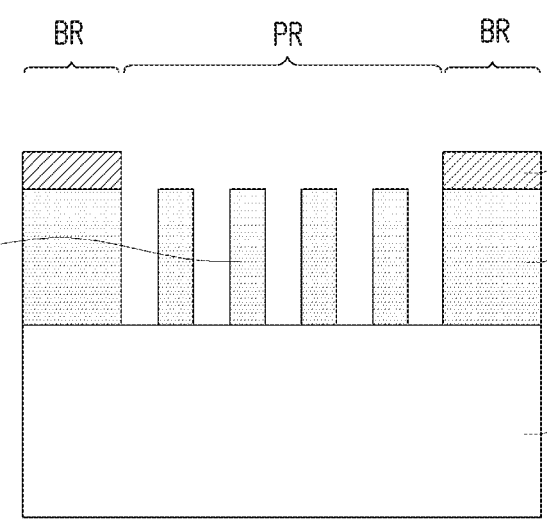
FIG. 24 shows one of various stages of a sequential manufacturing process of a phase shift photo mask according to another embodiment of the present disclosure.

FIG. 1 shows a plan view of an attenuated phase shift photo mask and FIGS. 11 and 24 show cross sectional views of the attenuated phase shift photo mask.

A phase shift photo mask as shown in FIG. 1 includes a pattern region PR, in which various circuit patterns are fabricated with a phase shift layer, and an opaque border region BR surrounding the pattern region PR. As shown in FIGS. 11 and 24, an attenuated phase shift photo mask includes a transparent substrate 10 having formed thereupon a series of patterned semi-transparent phase shift layers 15 disposed in the pattern region PR. Within the attenuated phase shift photo mask, the series of patterned semi-transparent phase shift layers is formed of a semi-transparent masking material, typically and preferably having a transmissivity of from about 3 percent to about 8 percent of an incident photo exposure radiation beam incident upon the phase shift photo mask. The incident photo exposure radiation beam (e.g., deep ultra violet light) includes a first incident light which passes through only the transparent substrate 10, a second incident light which passes through both the transparent substrate 10 and the patterned semi-transparent phase shift layer 15. The patterned semi-transparent phase shift layer 15 is formed of a composition, and in particular of a thickness, such that subsequent to passing through the attenuated phase shift photo mask, the first incident light and the second incident light are about 180 degrees out of phase, which in turn provides the enhanced intensity resolution of the exposure light once passed through the attenuated phase shift photo mask.

The opaque border region BR is a light blocking region having a Cr containing layer. In some embodiments, the opaque border region BR may include patterns, which are formed by a Cr containing layer and a transparent region and includes a photo mask alignment mark, a photo mask number, a name of the photo mask, etc.

As shown in FIGS. 11 and 24, the pattern area PR generally includes only the patterned semi-transparent phase shift layers, the border region BR includes light blocking patterns formed by, for example, metallic reflective material, such as a chromium layer. Accordingly, in a fabrication operations of the attenuated phase shift photo mask require etching of the light blocking layer and the phase shift layer.

In the pattern region PR, the light blocking layer (e.g., Cr containing layer) is removed during a manufacturing operation of the phase shift photo mask. The Cr containing layer is removed, for example, by one or more photolithography and etching operations including plasma dry etching. In the present disclosure, an operation including one or more photolithography and etching operations may be referred to as a photo-etching operation. The Cr containing layer, however, may not be completely removed, leaving behind Cr residues. The Cr residues can be detected by a photo mask inspection operation, and when unacceptable Cr residues (e.g., size and/or amount of Cr residues) are found, the phase shift photo mask will undergo one or more additional photolithography and etching operations (photo-etching operation). The additional Cr removal operation and inspection operation may be repeated until no Cr residue (or Cr defect) is found or the detected Cr residues are below the threshold size and/or amount. Additional Cr removal operation may increase the cost of manufacturing a phase photo mask and a turn-around time of the manufacturing process.

In the present disclosure, a novel manufacturing operation for a phase shift photo mask including a novel etching operation to effectively remove a Cr containing layer from the pattern region is disclosed.

FIGS. 2-11 show various stages for a sequential manufacturing process of a phase shift photo mask according to an embodiment of the present disclosure. It is understood that in the sequential manufacturing process, one or more additional operations can be provided before, during, and after the stages shown in the drawings, and some of the operations described below can be replaced or eliminated for additional embodiments of the method. The order of the operations/processes may be interchangeable.

First, a mask blank 10 is provided. The mask blank or a mask substrate 10 is made of a material transparent to deep ultra violet light (e.g., 245 nm light emitted from a KrF excimer laser or 193 nm light emitted from an ArF excimer laser). In some embodiments, the mask substrate 10 is made of quartz. In certain embodiments, a quartz mask substrate according to the 6025 SEMI standard is used for the mask substrate 10.

Figure 2:
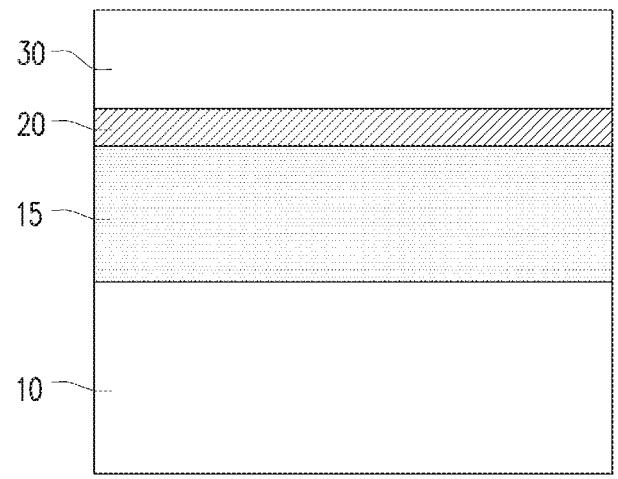
FIG. 2 shows one of various stages of a sequential manufacturing process of a phase shift photo mask according to one embodiment of the present disclosure.

As shown in FIG. 2, a phase shift layer 15 is formed on the mask substrate 10 and a light blocking layer 20 is formed on the phase shift layer 15. The phase shift layer may also be referred to as a light attenuating layer. The phase shift layer 15 has a material and sufficient thickness to pass from about 4% to about 40% of incident light with a phase shift of the transmitted light of about 180 degrees. In some embodiments, the phase shift layer 15 is made of, for example, but not limited to, at least one layer of MoSi, molybdenum silicon nitride ($MoSi_xN_y$) and molybdenum silicon oxynitride ($MoSi_xO_yN_z$). In other embodiments, the phase shift layer 15 is made of a silicon nitride based material, such as silicon nitride, silicon oxynitride, silicon carbo-nitride and/or silicon carbo-oxide. In certain embodiments, the phase shift layer 15 is made chromium based material, such as chromium oxide, chromium oxynitride ($CrO_xN_y$) and chromium nitride ($CrN_x$). The phase shift layer 15 can be a mono-layer or include two or more layers. In some embodiments, the phase shift layer 15 has a thickness of from about 50 nm to about 150 nm, depending on the optical properties of the material and the thickness required to retard the phase of transmitted light about 180 degrees. The phase shift layer 15 can be formed by ion beam deposition (IBD), atomic layer deposition (ALD), chemical vapor deposition (CVD), or physical vapor deposition (PVD) (sputtering).

The light blocking layer 20 is substantially opaque (non-transmitting) to incident light, for example, deep ultra violet light. In some embodiments, the light blocking layer 20 is a chromium containing layer, for example formed of at least one layer of Cr, chromium oxynitride ($CrO_xN_y$) and chromium nitride ($CrN_x$), having a thickness of less than about 50 nm to about 200 nm. The light blocking layer 20 can be formed by a sputtering method or other suitable film forming method.

Figure 3:
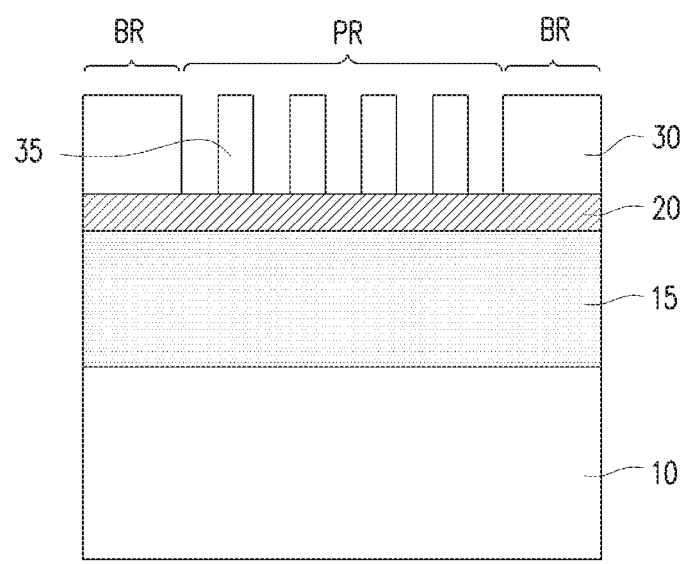
FIG. 3 shows one of various stages of a sequential manufacturing process of a phase shift photo mask according to one embodiment of the present disclosure.
Figure 4:
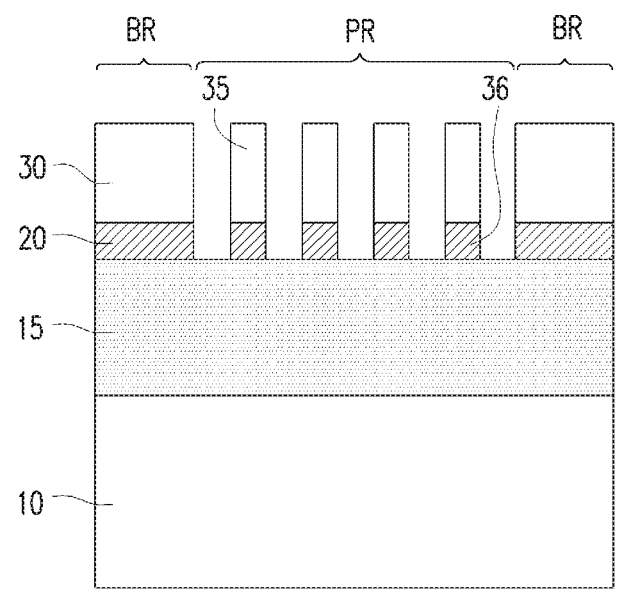
FIG. 4 shows one of various stages of a sequential manufacturing process of a phase shift photo mask according to one embodiment of the present disclosure.

As shown in FIG. 2, a first photo resist layer 30 is formed over the light blocking layer 20. Before the first photo resist layer 30 is formed, the photo mask blank with the phase shift layer 15 and the light blocking layer 20 is subject to inspection. Then, the first photo resist layer 30 is exposed with an electron beam according to a layout design having desired circuit patterns. FIG. 3 shows a cross sectional view after the exposed first photo resist layer 30 is developed with a developing solution. In some embodiments, after the development of the photo resist layer first, a post baking operation is performed to harden the developed photo resist pattern 35.

Figure 5:
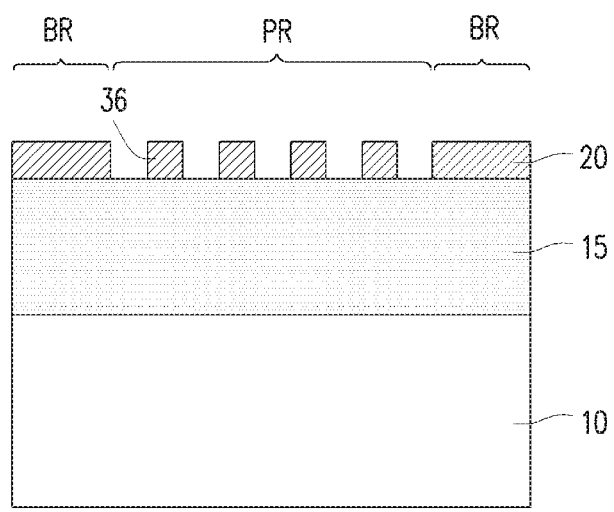
FIG. 5 shows one of various stages of a sequential manufacturing process of a phase shift photo mask according to one embodiment of the present disclosure.

Further, by using the photo resist pattern 35 as an etching mask, the light blocking layer (Cr containing layer) 20 is etched, to form a pattern 36. The etching of the light blocking layer 20 can be performed by dry etching and/or wet etching in some embodiments. After the light blocking layer 20 is etched, the photo resist pattern 35 is removed by appropriate removal and cleaning operations, as shown in FIG. 5.

Figure 6:
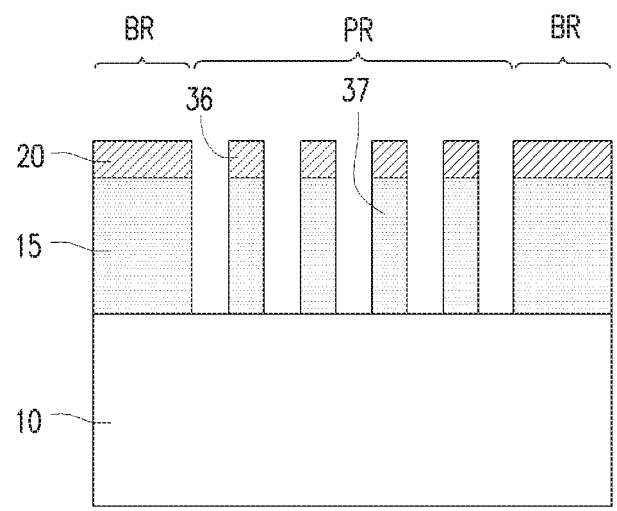
FIG. 6 shows one of various stages of a sequential manufacturing process of a phase shift photo mask according to one embodiment of the present disclosure.

Next, as shown in FIG. 6, by using the pattern 36 formed by the light blocking layer 20 as an etching mask, the phase shift layer 15 is etched, to form a phase shift pattern 37. The etching of the phase shift layer 15 can be performed by dry etching and/or wet etching in some embodiments. After the etching, the mask substrate is removed from the etching chamber, and a cleaning operation is performed in some embodiments.

Figure 7:
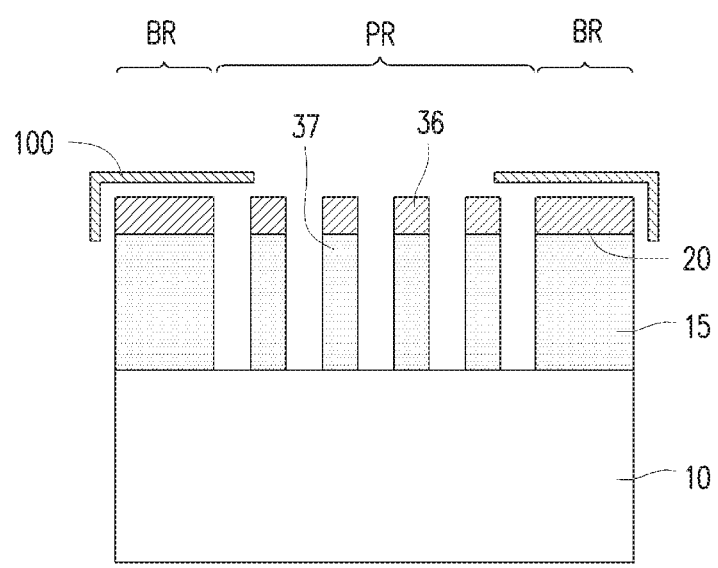
FIG. 7 shows one of various stages of a sequential manufacturing process of a phase shift photo mask according to one embodiment of the present disclosure.

Subsequently, an etching hard cover 100 is placed over the photo mask as shown in FIG. 7. The etching hard cover 100 is a separately prepared piece and placed on or over the photo mask. The etching hard cover 100 covers the opaque border region BR and has an opening over the pattern region PR. In some embodiments, the etching hard cover 100 is manually placed on the photo mask by an operator, and the photo mask with the etching hard cover 100 is loaded into an etching apparatus. In other embodiments, the etching hard cover 100 is movably disposed inside an etching apparatus and when the photo mask is loaded, the etching hard cover 100 is placed on the photo mask by mechanical operations.

Figure 8:
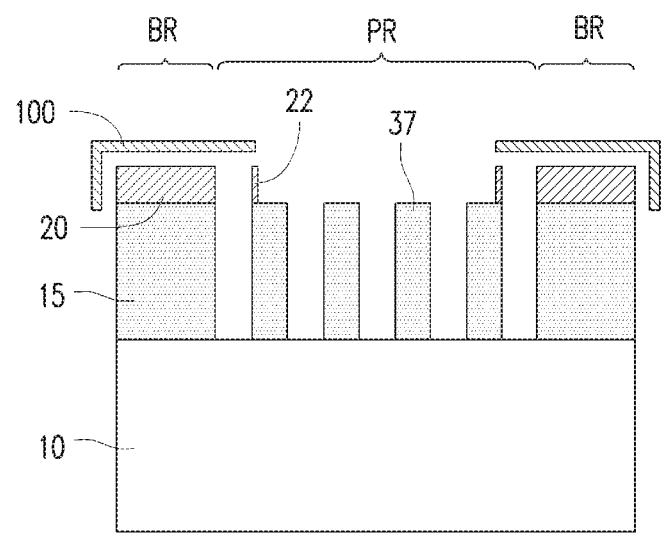
FIG. 8 shows one of various stages of a sequential manufacturing process of a phase shift photo mask according to one embodiment of the present disclosure.

By using the etching hard cover 100 as an etching mask, the light blocking layer 20 in the pattern region PR is removed. As shown in FIG. 8, the etching hard cover 100 covers a part of the pattern region PR in some embodiments. Thus, the light blocking layer 20 located under the etching hard cover 100 in the pattern region PR is not etched, forming residues 22. After the light blocking layer 20 in the pattern region PR is etched, the etching hard cover 100 is removed (detached) and a cleaning operation is performed in some embodiments. The removed etching hard cover 100 is placed on a holder and reused for the next-processed photo mask.

Figure 9:
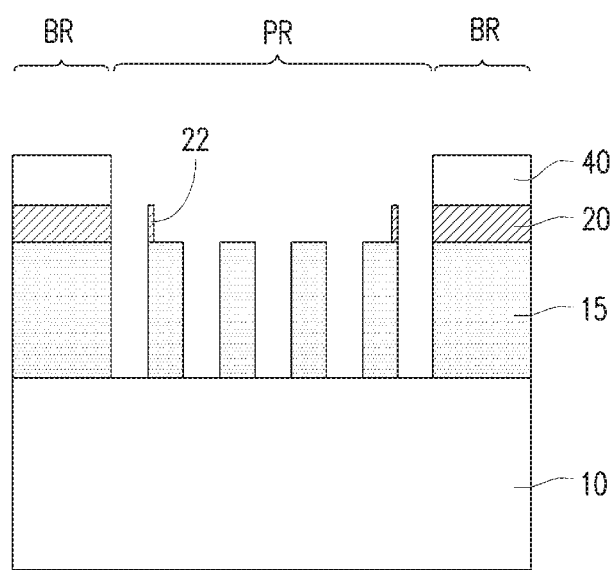
FIG. 9 shows one of various stages of a sequential manufacturing process of a phase shift photo mask according to one embodiment of the present disclosure.

Subsequently, a second photo resist layer 40 is coated on the patterned photo mask, and a lithography operation using electron beam lithography or optical lithography and a resist development operation are performed. As shown in FIG. 9, the second photo resist pattern 40 formed on the light blocking layer 20 remains at the opaque border region BR.

Figure 10:
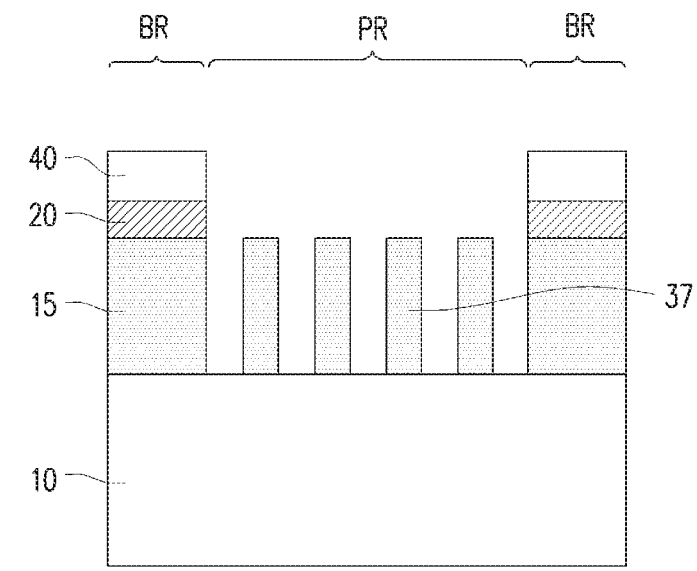
FIG. 10 shows one of various stages of a sequential manufacturing process of a phase shift photo mask according to one embodiment of the present disclosure.

Then, as shown in FIG. 10, by using the second photo resist pattern 40 formed on the border region BR as an etching mask, the light blocking layer 22 (residues) remaining on the phase shift layer 15 at the pattern region PR is etched. The etching of the light blocking layer 22 can be performed by dry etching in some embodiments. Then, the second photo resist pattern 40 is removed by an appropriate resist removal operation, as shown in FIG. 11. After the etching, a cleaning operation is performed in some embodiments.

After the cleaning operation, an inspection operation is performed to detect residues of the light blocking layer (e.g., Cr residues). When unacceptable Cr residues (e.g., size and/or amount of Cr residues) are found, the phase shift photo mask will undergo one or more additional photolithography and etching operations (photo-etching operation) similar to the operations described in relation to FIGS. 9 and 10. The additional Cr removal operation and the inspection operation may be repeated until no Cr residue (or Cr defect) is found or the detected Cr residues are below the threshold size and/or amount.

In the foregoing embodiment, the light blocking layer 20 in the pattern region PR is first "roughly" etched and removed by using an etching hard cover, and thus it is possible to eliminate a photolithography operation.

Figure 12:
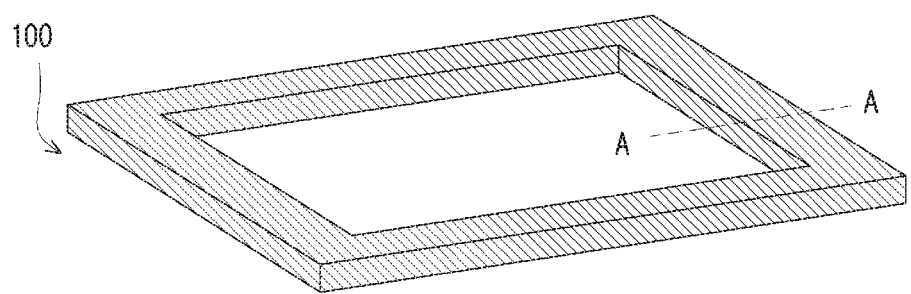
FIG. 12 shows a schematic view of a hard etching cover according to one embodiment of the present disclosure.

FIG. 12 is a perspective view of the etching hard cover 100. As shown in FIG. 12, the etching hard cover 100 has a rectangular frame shape having an opening corresponding to the pattern region PR of a phase shift photo mask. The etching hard cover 100 is made of a material that can endure the plasma etching of the light blocking layer (Cr contacting layer) 20. In some embodiments, the etching hard cover is made of ceramic. Ceramic material includes, for example, but not limited to, boron nitride, alumina, silicon nitride (crystalline), silicon carbide, zirconia, and/or barium titanate. The ceramic material may be a sintered body. In other embodiments, glass or metallic material can be used for the etching hard cover 100. In some embodiments, the surface of the etching hard cover 100 is coated with a coating material such as a silicon oxide, silicon nitride or any other material durable to the etching gas for the light blocking layer 20. The etching hard cover 100 is attachable to and detachable from the photo mask substrate 10 with films to be processed and is reusable.

Figure 13A:
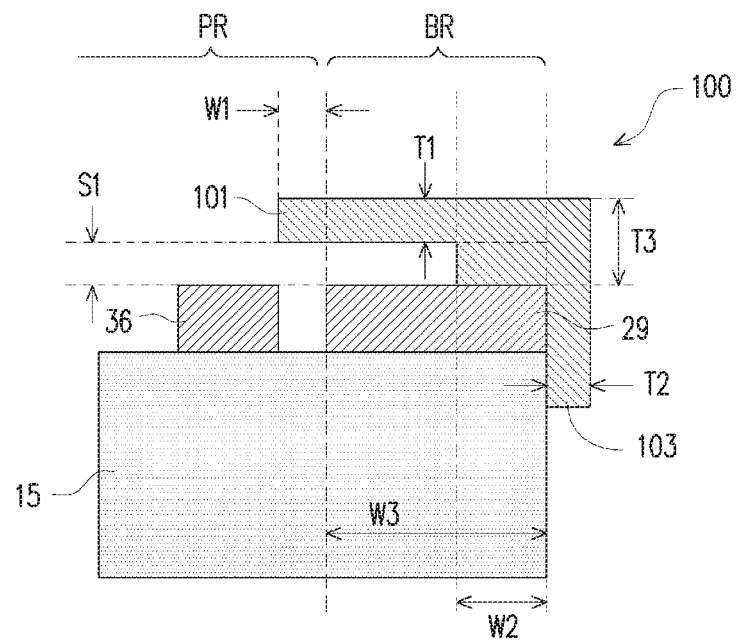
FIG. 13A shows a schematic cross sectional view of a side frame shape of the hard etching cover according to one embodiment of the present disclosure.

FIG. 13A shows a cross sectional view corresponding to line A-A of FIG. 12 of a side frame of the etching hard cover 100. The main cover portion 101 of the etching hard cover 100, which is to be placed over the pattern region PR of the phase shift photo mask, has a thickness T1 in a range from about 0.3 mm to about 0.8 mm in some embodiments. In some embodiments, the etching hard cover 100 is placed on the photo mask in contact with the light blocking layer 20 at the border region BR, as shown in FIG. 13A. The space S1 between the lower surface of the main cover portion 101 of the etching hard cover 100 and the upper surface of the light blocking layer 20 is in a range from about 0.3 mm to about 0.8 mm in some embodiments. Accordingly, the side frame to be in contact with the upper surface of the light blocking layer 20 has a thick portion having a thickness T3 (=T1+S1) in a range from about 0.6 mm to about 1.6 mm in some embodiments. The side end portion 103 (skirt portion) has a thickness T2 in a range from about 0.3 mm to about 0.8 mm in some embodiments.

As shown in FIG. 13A, the etching hard cover 100 is in direct contact with the upper surface of the light blocking layer 20 at the border region BR. The width W2 of the area at which the etching hard cover 100 is in direct contact with the upper surface of the light blocking layer 20 is in a range about 10% to about 90% of the width W3 of the border region BR, and is in a range about 20% to about 80% of the width W3 of the border region BR, in other embodiments.

Figure 13B:
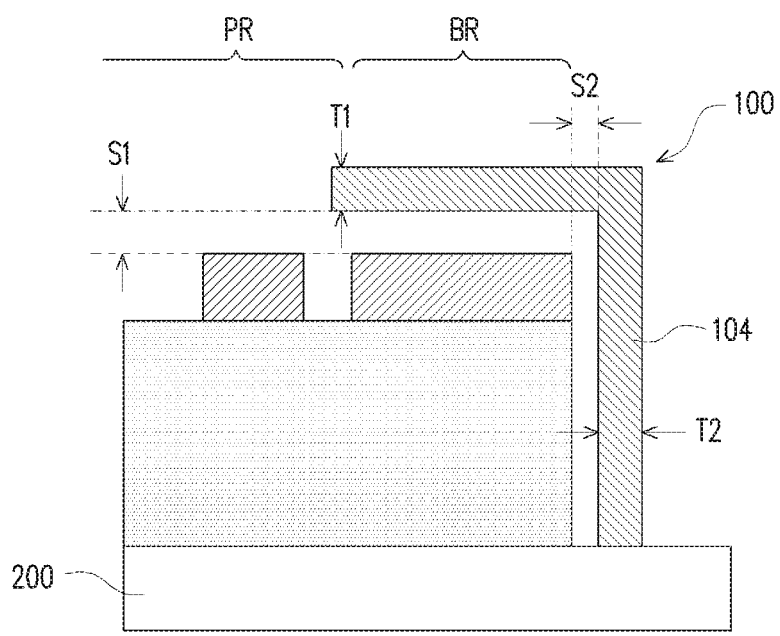
FIG. 13B shows a schematic cross sectional view of a side frame shape of the hard etching cover according to another embodiment of the present disclosure.

In other embodiments, as shown in FIG. 13B, the etching hard cover 100 does not directly contact with the upper surface of the photo mask (the upper surface of the light blocking layer 20. For example, a skirt portion 104 of the etching hard cover 100 has a long dimension such that the bottom of the etching hard cover 100 is placed on a mask stage 200 of an etching apparatus, on which the photo mask is placed.

Figure 13C:
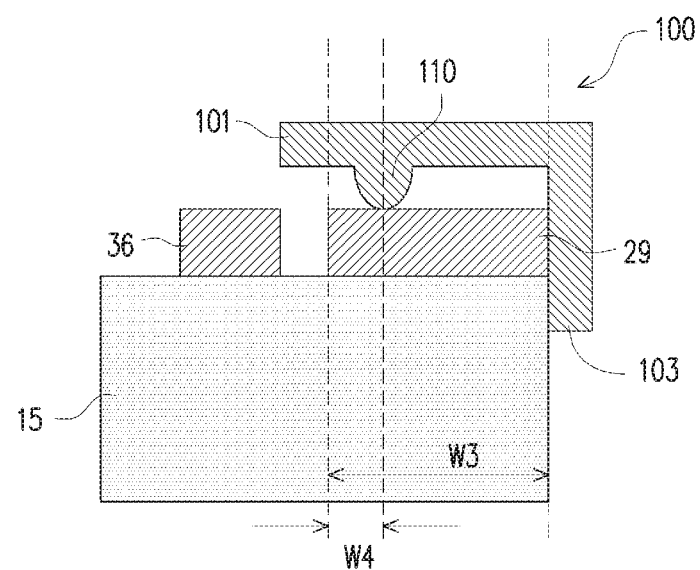
FIG. 13C shows a schematic cross sectional view of a side frame shape of the hard etching cover according to another embodiment of the present disclosure.

FIG. 13C shows another embodiment of the etching hard cover 100. In this embodiment, the lower surface of the main cover portion 101 of the etching cover 100 includes an abutting portion, for example, a protrusion 110 that contacts the upper surface of the light blocking layer 20 at the border region BR. The position W4 of the protrusion 110 is in a range about 10% to about 90% of the width W3 of the border region BR in some embodiments, and in a range about 20% to about 50% of the width W3 of the border region BR in other embodiments. In the case of the protrusion, it is possible to minimize the contact area of the etching hard cover 100 to the surface of the light blocking layer 20. In other embodiments, a protrusion similar to the protrusion 110 is formed at the inside surface of the skirt portion 102 to be in contact with the side face of the mask substrate 10. In certain embodiments, the shape of the etching hard cover 100 shown in FIG. 13A and the protrusion 110 shown in FIG. 13C are combined.

Figure 13D:
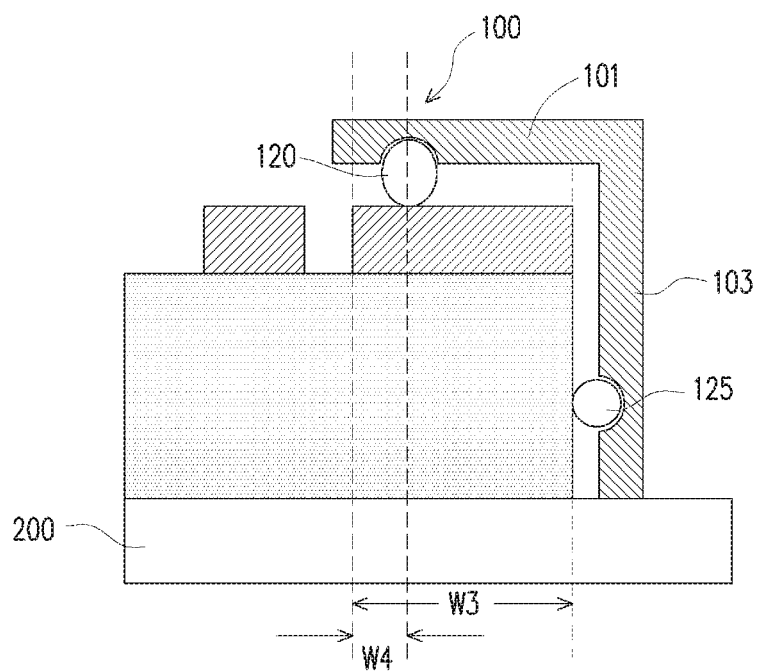
FIG. 13D shows a schematic cross sectional view of a side frame shape of the hard etching cover according to another embodiment of the present disclosure.

FIG. 13D shows another embodiment of the etching hard cover 100. In this embodiment, instead of a protrusion shown in FIG. 13C, an O-ring 120 embedded in a groove formed on the lower surface of the main cover portion 101 in contact with the upper surface of the light blocking layer 20 at the border region BR is used.

The position W4 of the center of the O-ring 120 (groove) is in a range about 10% to about 90% of the width W3 of the border region BR in some embodiments, and in a range about 20% to about 50% of the width W3 of the border region BR in other embodiments. The O-ring 120 is made of, for example, but not limited to, rubber (e.g., butadiene rubber, butyl rubber, ethylene propylene diene monomer rubber, or nitrile rubber), polytetrafluoroethylene (PTFE), perfluoroelastomer, or silicone. Similar to the protrusion 110, the use of the O-ring 120 can minimize the contact area of the etching hard cover 100 to the surface of the light blocking layer 20. In other embodiments, a second O-ring 125 is embedded in a groove formed on the inside surface of the skirt portion 103 and contacts the side face of the mask substrate 10. When the second O-ring 125 is used, it is not necessary for the skirt portion 103 to be in contact with the mask stage 200. In some embodiments, only the second O-ring 125 is used. In certain embodiments, the shape of the etching hard cover 100 show in FIG. 13A and the first O-ring 120 and/or the second O-ring 125 shown in FIG. 13C are combined.

FIGS. 14-24 show various stages for a sequential manufacturing process of a phase shift photo mask according to another embodiment of the present disclosure. It is understood that in the sequential manufacturing process, one or more additional operations can be provided before, during, and after the stages shown in the drawings, and some of the operations described below can be replaced or eliminated for additional embodiments of the method. The order of the operations/processes may be interchangeable. Materials, configurations, dimensions and/or processes the same as or similar to the foregoing embodiments described by FIGS. 1-13D may be employed in the following embodiments, and detailed explanation thereof may be omitted.

First, a mask blank 10 is provided. The mask blank or a mask substrate 10 is made of a material transparent to deep ultra violet light (e.g., 245 nm light emitted from a KrF excimer laser or 193 nm light emitted from an ArF excimer laser). In some embodiments, the mask substrate 10 is made of quartz. In certain embodiments, a quartz mask substrate according to 6025 SEMI standard is used for the mask substrate 10.

Figure 14:
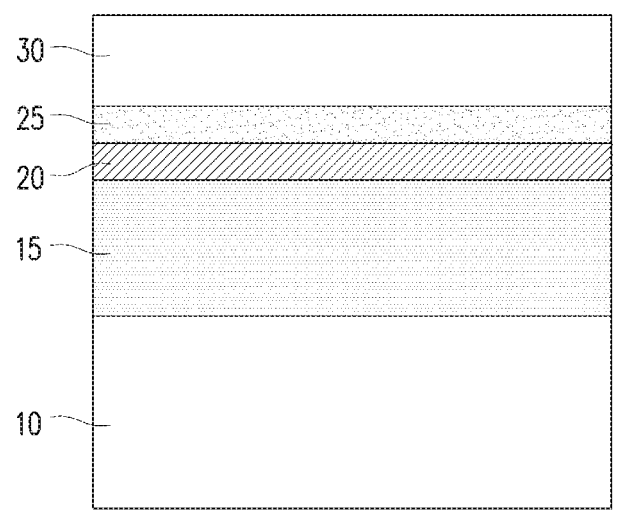
FIG. 14 shows one of various stages of a sequential manufacturing process of a phase shift photo mask according to another embodiment of the present disclosure.

As shown in FIG. 14, a phase shift layer 15 is formed on the mask substrate 10 and a light blocking layer 20 is formed on the phase shift layer 15. The phase shift layer may also be referred to as a light attenuating layer. The phase shift layer 15 has a material and sufficient thickness to pass from about 4% to about 40% of incident light with a phase shift of the transmitted light of about 180 degrees. In some embodiments, the phase shift layer 15 is made of, for example, but not limited to, at least one layer of MoSi, molybdenum silicon nitride ($MoSi_xN_y$) and molybdenum silicon oxynitride ($MoSi_xO_yN_z$). In other embodiments, the phase shift layer 15 is made of a silicon nitride based material, such as silicon nitride, silicon oxynitride, silicon carbo-nitride and/or silicon carbo-oxide. The phase shift layer 15 can be a mono-layer or include two or more layers. In some embodiments, the phase shift layer 15 has a thickness of from about 50 nm to about 150 nm, depending on the optical properties of the material and the thickness required to retard the phase of transmitted light about 180 degrees. The phase shift layer 15 can be formed by ion beam deposition (IBD), atomic layer deposition (ALD), chemical vapor deposition (CVD), or physical vapor deposition (PVD) (sputtering).

The light blocking layer 20 is substantially opaque (non-transmitting) to incident light, for example, deep ultra violet light. In some embodiments, the light blocking layer 20 is a chromium containing layer, for example formed of at least one layer of Cr, chromium oxynitride ($CrO_xN_y$) and chromium nitride ($CrN_x$), having a thickness less than about 50 nm to about 200 nm. The light blocking layer 20 can be formed by a sputtering method or other suitable film forming method.

As shown in FIG. 14, in this embodiment, a hard mask layer 25 is formed on the light blocking layer 20. The hard mask layer 25 is made of, for example, but not limited to, a silicon oxide based material or a silicon nitride based material. In some embodiments, silicon oxide or oxygen deficient silicon oxide ($SiO_x$) is used. A thickness of the hard mask layer 25 is in a range from about 10 nm to about 100 nm in some embodiments. The hard mask layer 25 can be formed by ion beam deposition (IBD), atomic layer deposition (ALD), chemical vapor deposition (CVD), or physical vapor deposition (PVD) (sputtering).

Figure 15:
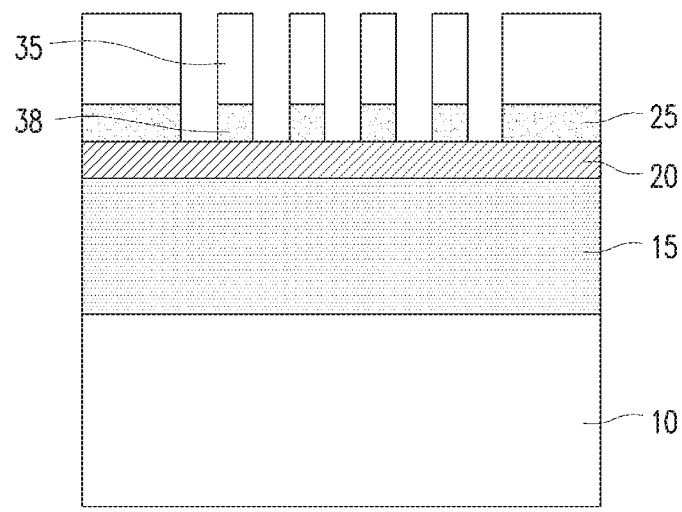
FIG. 15 shows one of various stages of a sequential manufacturing process of a phase shift photo mask according to another embodiment of the present disclosure.

Further, as shown in FIG. 14, a first photo resist layer 30 is formed over the hard mask layer 25. Before the first photo resist layer 30 is formed, the photo mask blank with the phase shift layer 15, the light blocking layer 20 and the hard mask layer 25 is subject to inspection. Then, the first photo resist layer 30 is exposed with an electron beam according to a layout design having desired circuit patterns. FIG. 15 shows a cross sectional view after the exposed first photo resist layer 30 is developed with a developing solution. In some embodiments, after the development of the photo resist layer first, a post basking operation to harden the developed photo resist pattern 35 is performed.

Figure 16:
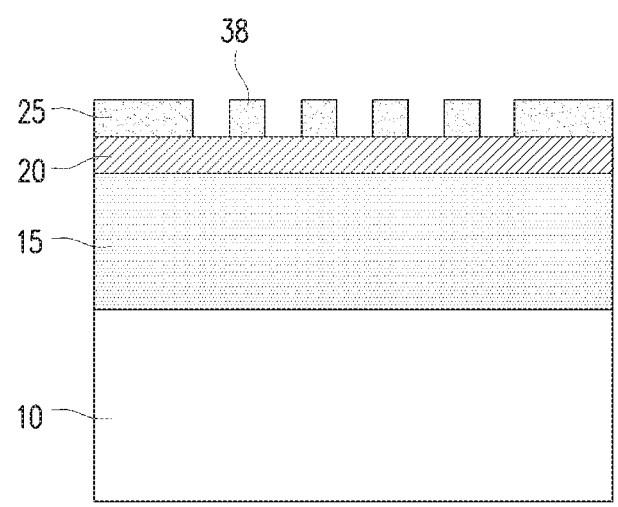
FIG. 16 shows one of various stages of a sequential manufacturing process of a phase shift photo mask according to another embodiment of the present disclosure.

Further, by using the photo resist pattern 35 as an etching mask, the hard mask layer 25 is etched to form a hard mask pattern 38. The etching of the hard mask layer 25 can be performed by dry etching and/or wet etching in some embodiments. After the hard mask layer 25 is etched, the photo resist pattern 35 is removed by appropriate removal and cleaning operations, as shown in FIG. 16.

Figure 17:
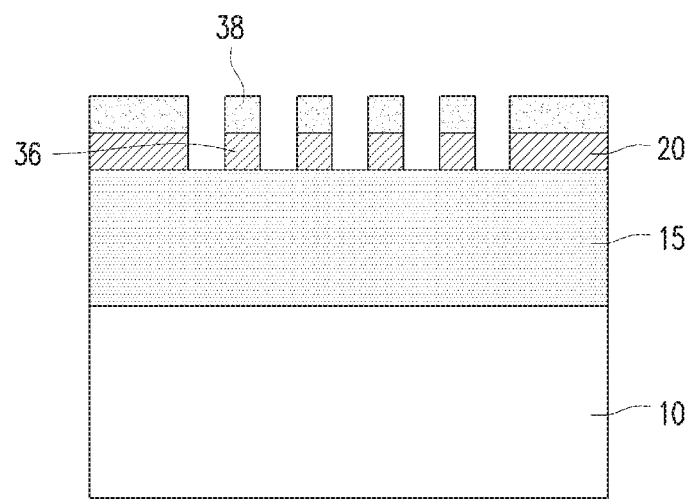
FIG. 17 shows one of various stages of a sequential manufacturing process of a phase shift photo mask according to another embodiment of the present disclosure.

Subsequently, by using the hard mask pattern 38 as an etching mask, the light blocking layer 20 is etched, to form a pattern 36, as shown in FIG. 17. The etching of the light blocking layer 20 can be performed by dry etching and/or wet etching in some embodiments.

Figure 18:
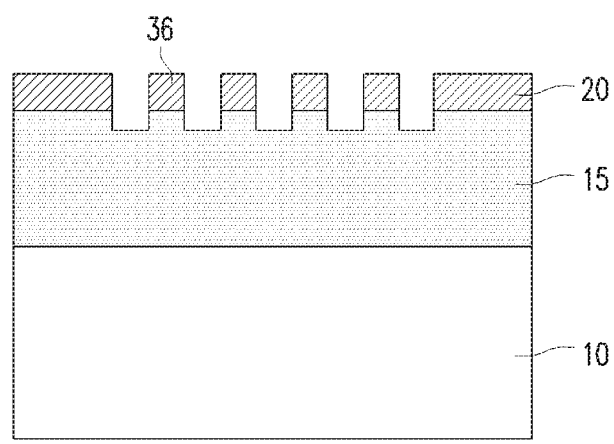
FIG. 18 shows one of various stages of a sequential manufacturing process of a phase shift photo mask according to another embodiment of the present disclosure.

After the light blocking layer 20 is etched, the hard mask pattern 38 is removed by appropriate removal and cleaning operations, as shown in FIG. 18. In some embodiments, the surface of the phase shift layer 15 is slightly etched when removing the hard mask pattern 38.

Figure 19:
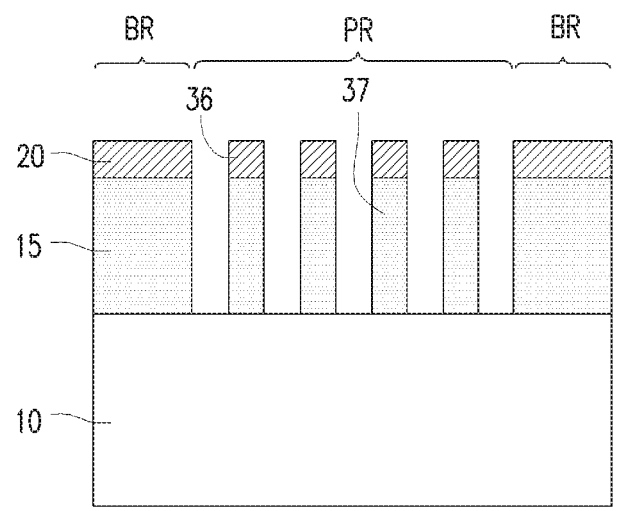
FIG. 19 shows one of various stages of a sequential manufacturing process of a phase shift photo mask according to another embodiment of the present disclosure.

Next, as shown in FIG. 19, by using the pattern 36 formed by the light blocking layer 20 as an etching mask, the phase shift layer 15 is etched, to form a phase shift pattern 37. The etching of the phase shift layer 15 can be performed by dry etching and/or wet etching in some embodiments. After the etching, a cleaning operation is performed in some embodiments.

Figure 20:
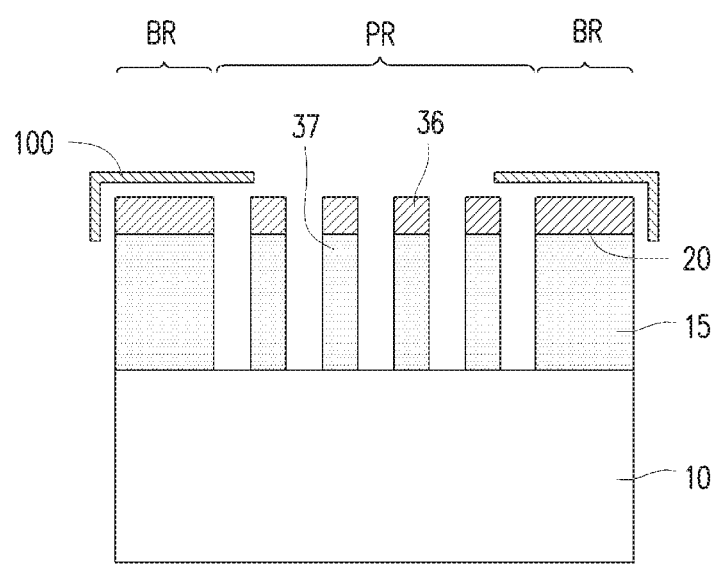
FIG. 20 shows one of various stages of a sequential manufacturing process of a phase shift photo mask according to another embodiment of the present disclosure.

Subsequently, an etching hard cover 100 is placed over the photo mask as shown in FIG. 20. The etching hard cover 100 is a separately prepared piece and placed on or over the photo mask. The etching hard cover 100 covers the opaque border region BR and has an opening over the pattern region PR.

Figure 21:
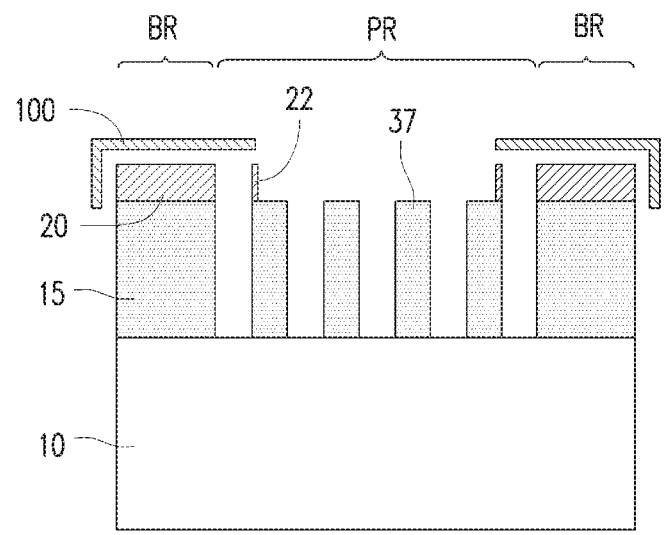
FIG. 21 shows one of various stages of a sequential manufacturing process of a phase shift photo mask according to another embodiment of the present disclosure.

By using the etching hard cover 100 as an etching mask, the light blocking layer 20 in the pattern region PR is removed. As shown in FIG. 21, the etching hard cover 100 covers a part of the pattern region PR in some embodiments. Thus, the light blocking layer 20 located under the etching hard cover 100 in the pattern region PR is not etched, forming residues 22. After the light blocking layer 20 in the pattern region PR is etched, the etching hard cover 100 is removed and a cleaning operation is performed in some embodiments.

Figure 22:
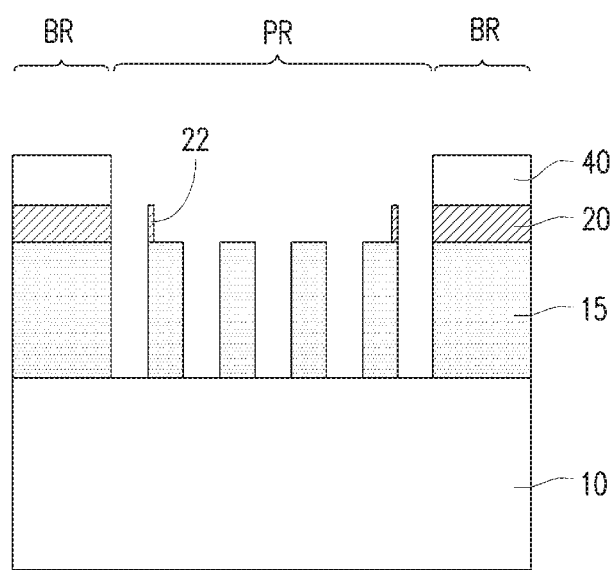
FIG. 22 shows one of various stages of a sequential manufacturing process of a phase shift photo mask according to another embodiment of the present disclosure.

Subsequently, a second photo resist layer 40 is coated on the patterned photo mask, and a lithography operation using electron beam lithography or optical lithography and a resist development operation are performed. As shown in FIG. 22, the second photo resist pattern 40 is formed on the light blocking layer 20 remaining at the opaque border region BR.

Figure 23:
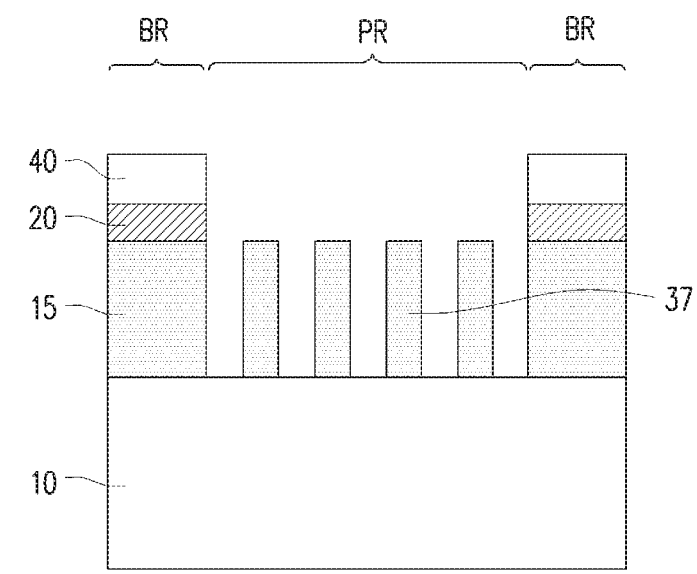
FIG. 23 shows one of various stages of a sequential manufacturing process of a phase shift photo mask according to another embodiment of the present disclosure.

Then, as shown in FIG. 23, by using the second photo resist pattern 40 formed on the border region BR as an etching mask, the light blocking layer 22 (residues) remaining on the phase shift layer 15 at the pattern region PR is etched. The etching of the light blocking layer 22 can be performed by dry etching in some embodiments. Then, the second photo resist pattern 40 is removed by an appropriate resist removal operation, as shown in FIG. 24. After the etching, a cleaning operation is performed in some embodiments.

After the cleaning operation, an inspection operation is performed to detect residues of the light blocking layer (e.g., Cr residues). When unacceptable Cr residues (e.g., size and/or amount of Cr residues) are found, the phase shift photo mask will undergo one or more additional photolithography and etching operations similar to the operations with respect to FIGS. 22 and 23. The additional Cr removal operation and the inspection operation may be repeated until no Cr residue (or Cr defect) is found or the detected Cr residues are below the threshold size and/or amount.

In the foregoing embodiment, the light blocking layer 20 in the pattern region PR is first "roughly" etched and removed by using an etching hard cover, and thus it is possible to eliminate a photolithography operation.

It will be understood that not all advantages have been necessarily discussed herein, no particular advantage is required for all embodiments or examples, and other embodiments or examples may offer different advantages.

For example, by using a detachable etching hard cover in the etching operation for the light blocking layer (Cr containing layer) in the pattern region, while covering the border region, it is possible to eliminate at least one lithography operation including resist coating, exposure and development of the exposed resist during a manufacturing operation of an attenuated phase shift photo mask. Further, it is possible to effectively remove the light blocking layer and its residues from the pattern region.

In accordance with an aspect of the present disclosure, in a method of manufacturing a photo mask, a photo resist layer is formed over a mask blank, which includes a mask substrate, a phase shift layer disposed on the mask substrate and a light blocking layer disposed on the phase shift layer. A photo resist pattern is formed by using a lithographic operation. The light blocking layer is patterned by using the photo resist pattern as an etching mask. The phase shift layer is patterned by using the patterned light blocking layer as an etching mask. A border region of the mask substrate, on which part of the light blocking layer remains, is covered with an etching hard cover, while a pattern region of the mask substrate is exposed through an opening of the etching hard cover. The patterned light blocking layer in the pattern region is patterned through the opening of the etching hard cover. The etching hard cover is detached. A photo-etching operation is performed on the pattern region to remove residues of the light blocking layer. In one or more of the foregoing and following embodiments, the etching hard cover is reusable. In one or more of the foregoing and following embodiments, the etching hard cover is made of ceramic. In one or more of the foregoing and following embodiments, the etching hard cover has a frame shape having the opening and a frame portion defining the opening. In one or more of the foregoing and following embodiments, the frame portion covers the border region. In one or more of the foregoing and following embodiments, the frame portion partially covers the pattern region. In one or more of the foregoing and following embodiments, the phase shift layer include one or more layers of molybdenum silicide, molybdenum silicon nitride, and molybdenum silicon oxynitride. In one or more of the foregoing and following embodiments, after performing the photo-etching operation, the pattern region is inspected. When an inspecting result is undesirable, repeating the photo-etching operation on the pattern region and the inspecting until a desirable inspecting result is obtained. In one or more of the foregoing and following embodiments, the border region of the mask substrate is covered by the etching hard cover such that the etching hard cover is in contact with the light blocking layer at the border region. In one or more of the foregoing and following embodiments, the border region of the mask substrate is covered by the etching hard cover such that the etching hard cover is not in contact with the light blocking layer at the border region. In one or more of the foregoing and following embodiments, the border region of the mask substrate is covered by the etching hard cover such that the etching hard cover is in contact with the mask substrate.

In accordance with another aspect of the present disclosure, in a method of manufacturing a photo mask, a photo resist layer is formed over a mask blank, which includes a mask substrate, a phase shift layer disposed on the mask substrate, a light blocking layer disposed on the phase shift layer and a hard mask layer disposed on the light blocking layer. A photo resist pattern is formed by using a lithographic operation. The hard mask layer is patterned by using the photo resist pattern as an etching mask. The light blocking layer is patterned by using the patterned hard mask layer as an etching mask. The phase shift layer is patterned by using the patterned light blocking layer as an etching mask. A border region of the mask substrate, on which part of the light blocking layer remains, is covered with an etching hard cover, while a pattern region of the mask substrate is exposed through an opening of the etching hard cover. The patterned light blocking layer in the pattern region is etched through the opening of the etching hard cover. The etching hard cover is detached. A photo-etching operation is performed on the pattern region to remove residues of the light blocking layer. In one or more of the foregoing and following embodiments, the etching hard cover is reusable. In one or more of the foregoing and following embodiments, the etching hard cover is made of ceramic. In one or more of the foregoing and following embodiments, the etching hard cover has a frame shape having the opening and a frame portion defining the opening. In one or more of the foregoing and following embodiments, the frame portion fully covers the border region, and partially covers the pattern region. In one or more of the foregoing and following embodiments, the border region of the mask substrate is covered by the etching hard cover such that the etching hard cover is in contact with the light blocking layer at the border region. In one or more of the foregoing and following embodiments, the border region of the mask substrate is covered by the etching hard cover such that the etching hard cover is not in contact with the light blocking layer at the border region. In one or more of the foregoing and following embodiments, the border region of the mask substrate is covered by the etching hard cover such that the etching hard cover is in contact with the mask substrate.

In accordance with another aspect of the present disclosure, an etching hard cover for a photo mask manufacturing operation is made of ceramic, and has a frame shape having the opening and a frame portion defining the opening. The frame portion includes a main cover portion that covers a border region of the photo mask to be manufactured. A bottom surface of the main cover portion includes an abutting portion to abut the photo mask, when the etching hard cover is placed on the photo mask.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus for a photo mask manufacturing operation comprising an etching hard cover, wherein:
    the etching hard cover is a reusable ceramic comprising a sintered body,
    the etching hard cover has a rectangular frame shape having a rectangular opening and a rectangular frame portion defining the rectangular opening,
    the frame portion includes a main cover portion that covers a border region of the photo mask to be manufactured, and
    a bottom surface of the main cover portion includes an abutting portion to abut the photo mask, when the etching hard cover is placed on the photo mask, the border region of the photo mask is covered by the etching hard cover such that the etching hard cover is in contact with a light blocking layer disposed at the border region.

2. The apparatus of claim 1, wherein the sintered body comprises at least one of boron nitride, alumina, crystalline silicon nitride, silicon carbide, zirconia, and barium titanate, or a coating of silicon oxide or silicon nitride.

3. The apparatus of claim 1, wherein the etching hard cover has a frame shape having the opening and a frame portion defining the opening.

4. The apparatus of claim 3, wherein the frame portion covers the border region.

5. The apparatus of claim 4, wherein the frame portion partially covers a pattern region of the photo mask to be manufactured.

6. The apparatus of claim 1, wherein the border region of the mask substrate is covered by the etching hard cover such that the etching hard cover is in contact with the mask substrate.

7. An etching hard cover for a photo mask manufacturing operation, wherein:
    the etching hard cover is a reusable ceramic comprising at least one of boron nitride, crystalline silicon nitride, silicon carbide, zirconia, and barium titanate, or a coating of silicon oxide or silicon nitride,
    the etching hard cover has a rectangular frame shape having a rectangular opening and a rectangular frame portion defining the rectangular opening,
    the frame portion includes a main cover portion that covers a border region of the photo mask to be manufactured, and
    a bottom surface of the main cover portion includes an abutting portion to abut the photo mask, when the etching hard cover is placed on the photo mask, the border region of the photo mask is covered by the etching hard cover such that the etching hard cover is in contact with a light blocking layer disposed at the border region.

8. The etching hard cover of claim 7, wherein the reusable ceramic etching hard cover is a sintered body.

9. The etching hard cover of claim 7, wherein the etching hard cover has a frame shape having the opening and a frame portion defining the opening.

10. The etching hard cover of claim 9, wherein the frame portion covers the border region.

11. The etching hard cover of claim 10, wherein the frame portion partially covers a pattern region of the photo mask to be manufactured.

12. The etching hard cover of claim 7, wherein the border region of the mask substrate is covered by the etching hard cover such that the etching hard cover is in contact with the mask substrate.

13. An etching hard cover for a photo mask manufacturing operation, wherein:
   the etching hard cover has a rectangular frame shape having a rectangular opening and a rectangular frame portion defining the rectangular opening,
   the frame portion includes a main cover portion that covers a border region of the photo mask to be manufactured and a side end portion extending transversely from an end of the main cover portion,
   at least one dimension of the side end portion is longer than dimensions of the main cover portion such that the side end portion contacts a mask stage of an etching apparatus when the etching hard cover is placed on the mask stage, and
   surfaces of the main cover portion and the side end portion facing the photo mask each include a groove configured to receive an O-ring.

14. The etching hard cover of claim 13, wherein the etching hard cover is a reusable ceramic comprising at least one of boron nitride, crystalline silicon nitride, silicon carbide, zirconia, and barium titanate, or a coating of silicon oxide or silicon nitride.

15. The etching hard cover of claim 13, wherein the etching hard cover includes glass or metallic material.

16. The etching hard cover of claim 13, wherein the frame portion covers the border region of the photo mask to be manufactured.

17. The etching hard cover of claim 16, wherein the frame portion partially covers a pattern region of the photo mask to be manufactured.

18. The etching hard cover of claim 13, wherein the etching hard cover covers the border region of the photo mask such that the etching hard cover is spaced from the photo mask.

19. The etching hard cover of claim 13, wherein the etching hard cover comprises a sintered body.

20. The etching hard cover of claim 13, wherein a position of a center of the groove in the main cover portion is in a range between 10% to 90% of a width of the border region.

* * * * *